United States Patent

McAnally et al.

[11] Patent Number: 5,960,304
[45] Date of Patent: Sep. 28, 1999

[54] METHOD FOR FORMING A CONTACT TO A SUBSTRATE

[75] Inventors: Peter S. McAnally, McKinney; Jeffrey A. McKee, Grapevine, both of Tex.

[73] Assignee: Texas Instruments Incorporated, Dallas, Tex.

[21] Appl. No.: 08/856,855

[22] Filed: May 15, 1997

Related U.S. Application Data

[60] Provisional application No. 60/017,995, May 20, 1996.

[51] Int. Cl.⁶ .......................... H01L 21/44; H01L 21/768
[52] U.S. Cl. .......................... 438/597; 438/633; 438/634; 438/637
[58] Field of Search ...................... 438/636, 637, 438/702, 633, 595, 672, 572, 634, 597

[56] References Cited

U.S. PATENT DOCUMENTS

| | | | |
|---|---|---|---|
| 4,560,436 | 12/1985 | Bukhman et al. | 438/701 |
| 4,957,881 | 9/1990 | Crotti | 438/672 |
| 4,997,790 | 3/1991 | Woo et al. | 437/195 |
| 5,229,326 | 7/1993 | Dennison et al. | 437/195 |
| 5,240,554 | 8/1993 | Hori et al. | 438/702 |
| 5,270,263 | 12/1993 | Kim et al. | 438/702 |
| 5,302,240 | 4/1994 | Hori et al. | 438/702 |
| 5,436,205 | 7/1995 | Hirose | 438/572 |
| 5,466,639 | 11/1995 | Ireland | 438/633 |
| 5,518,961 | 5/1996 | Ishimaru | 438/595 |
| 5,578,524 | 11/1996 | Fukase et al. | 437/195 |
| 5,661,083 | 8/1997 | Chen et al. | 438/637 |
| 5,668,052 | 9/1997 | Mataumoto et al. | 438/636 |

FOREIGN PATENT DOCUMENTS

| | | | |
|---|---|---|---|
| 0 542 477 A1 | 11/1991 | European Pat. Off. | H01L 21/60 |
| 0 660 395 A2 | 11/1994 | European Pat. Off. | H01L 21/82 |
| WO 91/10261 | 7/1991 | WIPO | H01L 21/90 |

*Primary Examiner*—Peter Toby Brown
*Assistant Examiner*—Maria Guerrero
*Attorney, Agent, or Firm*—Mark A. Valetti; Carlton H. Hoel; Richard L. Donaldson

[57] ABSTRACT

A contact (26) to a substrate (12) is formed using a first stopping layer (14), an insulating layer (16), and a second stopping layer (18). The second stopping layer (18) promotes a more accurate and controlled removal of the first stopping layer (14). A self-aligned contact (122) may be formed in a similar manner using a first stopping layer (110), an insulating layer (112), and a second stopping layer (114).

1 Claim, 6 Drawing Sheets

METHOD FOR FORMING A CONTACT TO A SUBSTRATE

This application claims priority under 35 USC § 119(e)(1) of provisional application No. 60/017,995, filed May 20, 1996.

TECHNICAL FIELD OF THE INVENTION

This invention relates in general to the field of semiconductor fabrication, and more specifically to a method for forming a contact to a substrate.

BACKGROUND OF THE INVENTION

Semiconductor device fabrication involves the forming of different components on a substrate using a variety of techniques, such as deposition, patterning, and etching. One component in semiconductor devices is a contact for coupling a layer of material to the underlying substrate or another layer. Depending on the particular application and the desired function, contacts may be holes, vias, channels, or other geometric structures.

As semiconductor devices become more complex with greater component density, new techniques are developed to provide higher fabrication tolerances. For example, a technique has been developed for a self-aligned contact that reduces the spacing between adjacent gates separated by the self-aligned contact. Other techniques may also be used to improve component density on a semiconductor device. However, these techniques demand accurate and controlled removal of material to create a contact without interfering with surrounding components.

SUMMARY OF THE INVENTION

In accordance with the present invention, disadvantages and problems associated with a method for forming a contact to a substrate have been substantially reduced or eliminated.

In accordance with one embodiment of the present invention, a method for forming a contact to a substrate includes forming a first stopping layer overlying the substrate. An insulating layer overlying the first stopping layer is formed and a second stopping layer overlying the insulating layer is formed. Portions of the second stopping layer and the insulating layer are removed to define a contact region. The remaining second stopping layer and portions of the first stopping layer in the contact region are removed to form the contact.

In accordance with another embodiment of the present invention, a method for forming a self-aligned contact to a substrate includes forming a first gate and a second gate overlying the substrate. A first stopping layer overlying the first gate and the second gate is formed. An insulating layer overlying the first stopping layer is formed and a second stopping layer overlying the insulating layer is formed. Portions of the second stopping layer and the insulating layer are removed to define a contact region between the first gate and the second gate. The remaining second stopping layer and portions of the first stopping layer in the contact region are removed to form the contact.

Important technical advantages of the present invention include forming a stopping layer overlying an insulating layer to aid in the formation of a contact. Current fabrication techniques may form a first stopping layer, such as nitride, to protect a substrate during the formation of a contact. To complete formation of the contact, portions of the first stopping layer in the contact region should be removed with precision.

Over-etching during the removal of the first stopping layer may damage adjacent components. To precisely remove the first stopping layer overlying the substrate, the present invention forms a second stopping layer, such as nitride, that overlies the insulating layer. This second stopping layer may be etched simultaneously with the first stopping layer and provides an end point indication to more closely control the removal process. Furthermore, the second stopping layer may also act as a mask to protect the insulating layer during the formation of the contact region and during the removal of the first stopping layer.

Other important technical advantages of the present invention include a second stopping layer overlying the insulating layer that provides a consistent optical backdrop for more accurate patterning using, for example, a photolithography technique. Second stopping layer may obstruct underlying component details and provide a more consistent depth of focus for more accurate resist patterning. Since the second stopping layer provides an extra barrier of protection to the insulating layer, a thinner resist may be used, which further benefits patterning accuracy. Other important technical advantages are readily apparent to one skilled in the art from the following figures, descriptions, and claims.

BRIEF DESCRIPTION OF THE DRAWINGS

For a more complete understanding of the present invention, and for further features and advantages, reference is now made to the following description taken in conjunction with the accompanying drawings, in which.

DETAILED DESCRIPTION OF THE INVENTION

FIGS. 1A–1F illustrate a method for forming a contact to a substrate. The contact may be a hole, channel, via, line, or other structure that couples a layer of material to the underlying substrate or another layer. This method for forming a contact may be incorporated into the fabrication technique of memories such as dynamic random access memories (DRAMs), static random access memories (SRAMs), logical elements, microprocessors, controllers, or any other semiconductor device that includes a contact.

Figure 1A:
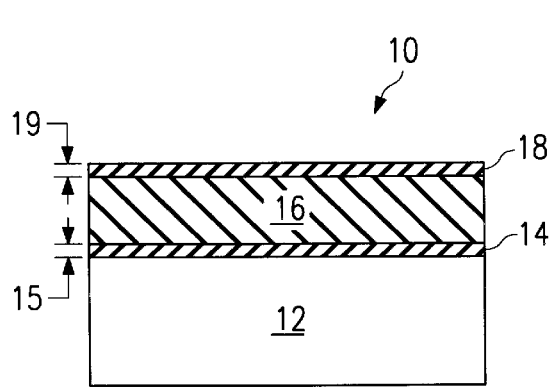
FIGS. 1A–1F illustrate a method for forming a contact to a substrate.

FIG. 1A illustrates a cross section of semiconductor device 10 during fabrication that includes a substrate 12 with several overlying layers. A first stopping layer 14 overlying substrate 12 has a generally uniform thickness 15. An insulating layer 16 overlies first stopping layer 14. A second stopping layer 18 overlying insulating layer 16 has a generally uniform thickness 19. Substrate 12, insulating layer 16, and stopping layers 14 and 18 may be formed using any appropriate deposition or growth technique, including without limitation chemical deposition at low pressure or using plasma, spin coating, sputtering, or epitaxial growth.

A planarization technique may be included during any phase of the formation of device 10 illustrated in FIG. 1A. Planarization may be accomplished by a reflow process, spin coating, mechanical or chemical polishing, a planarization etch, or other appropriate planarization technique. For example, after forming insulating layer 16, a planarization technique may be employed before forming second stopping layer 18.

Substrate 12 comprises silicon, silicon on insulator (SOI), or any other appropriate substrate for semiconductor fabrication. Insulating layer 16 may comprise oxide or a doped oxide, such as boron phospho-silicate glass (BPSG). First stopping layer 14 and second stopping layer 18 may comprise a nitride or nitride with some oxide material. In one embodiment, the material for insulating layer 16 and the material for stopping layers 14 and 18 are chosen so that later removal processes may be selective to one and not the other.

Figure 1B:
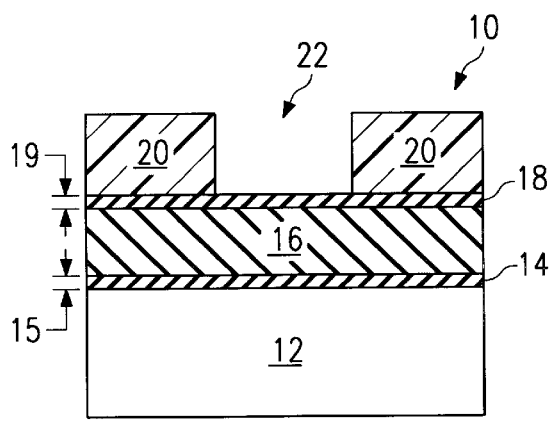

FIG. 1B illustrates device 10 after depositing a resist 20 overlying the second stopping layer and after patterning the resist 20 to define a contact region 22. Resist 20 may comprise any suitable patterning material that can define contact region 22. In one example, resist 20 may be a negative or positive photoresist that is patterned using an appropriate photolithography technique. Second stopping layer 18 may provide a consistent optical backdrop for more accurately patterning of resist 20. For example, second stopping layer 18 may obstruct underlying component details and provide a more consistent depth of focus for more accurate resist patterning.

Figure 1C:
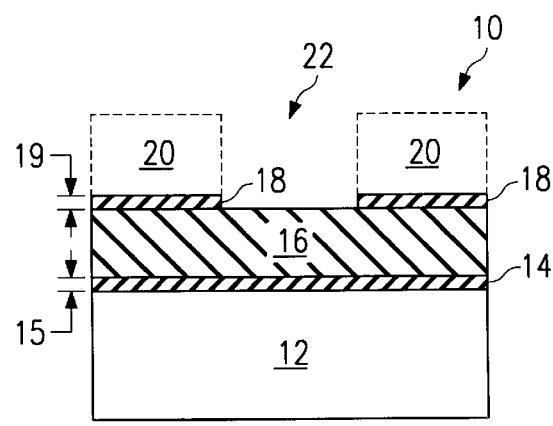

FIG. 1C illustrates device 10 after removing portions of second stopping layer 18 within contact region 22. This may be performed using, for example, an anisotropic etch technique that is selective to insulating layer 16. As indicated by the dashed lines, resist 20 is removed after removing portions of second stopping layer 18 within contact region 22. The resulting structure comprises a second stopping layer 18 patterned to define contact region 22.

Figure 1D:
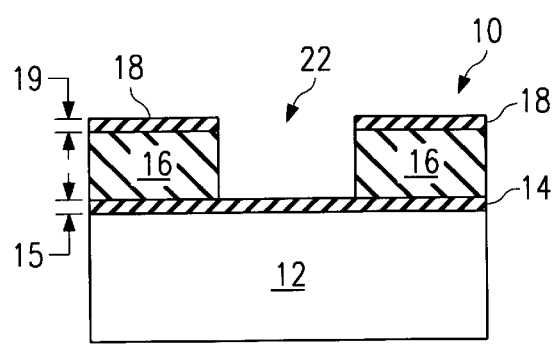

FIG. 1D illustrates device 10 after removing portions of insulating layer 16 in contact region 22. In this embodiment, second stopping layer 18 operates as a hard mask during the removal of portions of insulating layer 16. The removal process may be performed by, for example, an anisotropic etch that is selective to stopping layers 14 and 18. In this embodiment, the removal of portions of second stopping layer in FIG. 1C and the removal of portions of insulating layer 16 in FIG. 1D are performed using separate steps. The resulting structure illustrated in FIG. 1D comprises contact region 22 defined by the removal of vertically aligned portions of second stopping layer 18 and insulating layer 16.

Figure 1E:
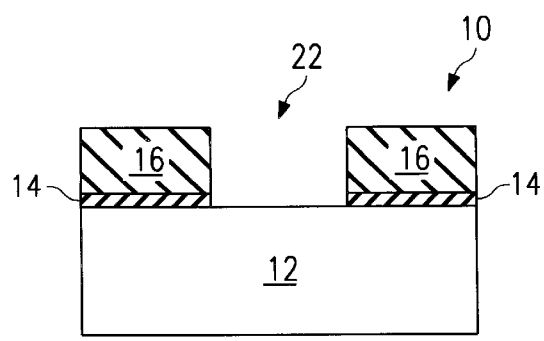

FIG. 1E illustrates device 10 after removal of the remaining second stopping layer 18 and portions of the first stopping layer 14 in contact region 22. The removal of both second stopping layer 18 and first stopping layer 14 may be accomplished in one process step, for example, using an anisotropic etching technique that is selective to insulating layer 16.

The simultaneous etching of first stopping layer 14 and second stopping layer 18 provides several technical advantages. In a typical semiconductor device, the visible surface area of the remaining second stopping layer 18 illustrated in FIG. 1D may comprise a large portion of the surface area of device 10. If second stopping layer 18 and insulating layer 16 exhibit different optical characteristics, then removal of second stopping layer 18 may provide an optical end point to more accurately control the etching of portions of first stopping layer 14 in contact region 22.

For example, first stopping layer 14 and second stopping layer 18 may be formed of the same material, such as nitride, with their respective thicknesses 15 and 19 substantially equal. In this embodiment, the removal of second stopping layer 18, detected optically or otherwise, may indicate the removal of portions of first stopping layer 14 in contact region 22. Moreover, thickness 15 of first stopping layer 14 may be chosen to be greater than or less than thickness 19 of second stopping layer 18 to provide an undershoot or overshoot margin, respectively, during the removal process that results in the structure of FIG. 1E. Therefore, second stopping layer 18 promotes a more accurate and controlled removal of portions of first stopping layer 14 within contact region 22.

Figure 1F:
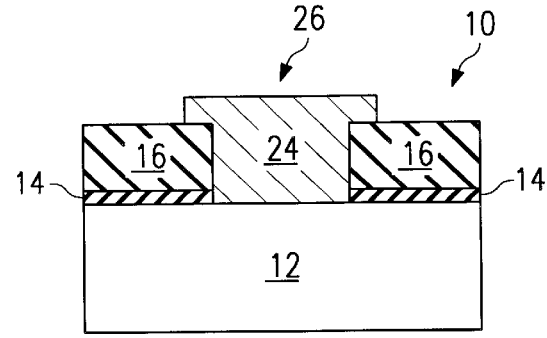

FIG. 1F illustrates device 10 after forming conductive material 24 in contact region 22 to complete fabrication of contact, shown generally as element 26. Contact 26 provides coupling between substrate 12 and one or more layers overlying substrate 12. Further fabrication of device 10 may incorporate contact 26 into a storage node capacitor, transistor, bit line component, word line component, or any other suitable component in a semiconductor device.

Figure 2A:
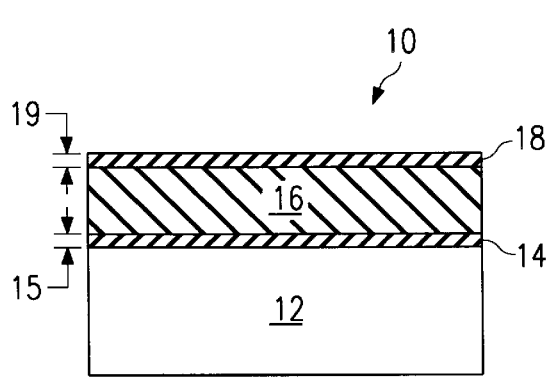
FIGS. 2A–2F illustrate an alternative method for forming a contact to a substrate.
Figure 2B:
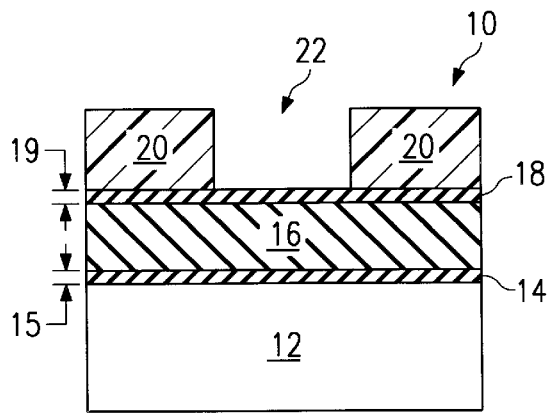
Figure 2C:
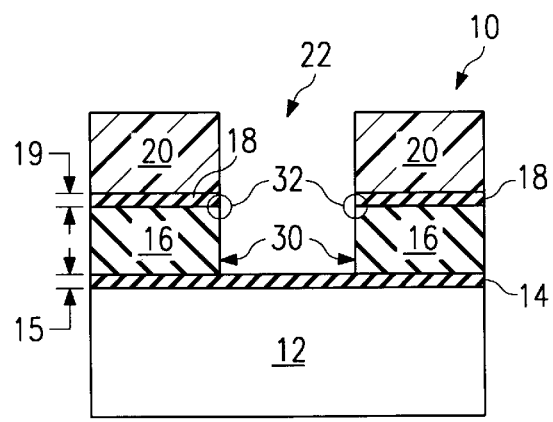

FIGS. 2A–2F illustrate an alternative method for forming contact 26 to substrate 12. FIGS. 2A and 2B illustrate the same process steps described above with reference to FIGS. 1A and 1B. However, instead of removing resist 20 as shown above in FIG. 1C, resist 20 remains in FIG. 2C during the removal of portions of insulating layer 16 in contact region 22.

In one embodiment, the removal of vertically-aligned portions of second stopping layer 18 and insulating layer 16 may be performed by an anisotropic etch that initially "blows through" portions of second stopping layer 18, and then develops selectivity to first stopping layer 14 as the etch progresses through insulating layer 16. The selectivity developed in a "blow through" etch may result from developing chemistries as etched particles and other residuals are released and interact with the etch process. In another embodiment, different removal processes may be used to specifically remove second stopping layer 18 and insulating layer 16 in two separate steps.

Using either a single "blow through" removal step or two separate removal steps, resist 20 and second stopping layer 18 together act as a hybrid soft/hard mask during removal of portions of insulating layer 16. For example, portions of resist 20, especially those portions adjacent to contact region 22, may be chipped away during the removal process to expose second stopping layer 18. Second stopping layer 18 may then provide additional protection from the etch process to maintain well-defined sidewalls 30 and sharp corners 32 of insulating layer 16. Furthermore, since second stopping layer 18 provides an extra barrier of protection to insulating layer 16, a thinner resist 20 may be used to improve patterning accuracy.

Figure 2D:
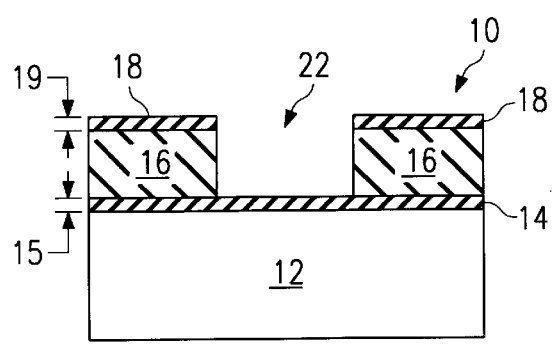
Figure 2E:
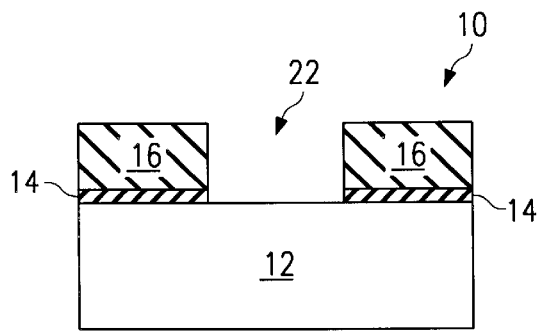
Figure 2F:
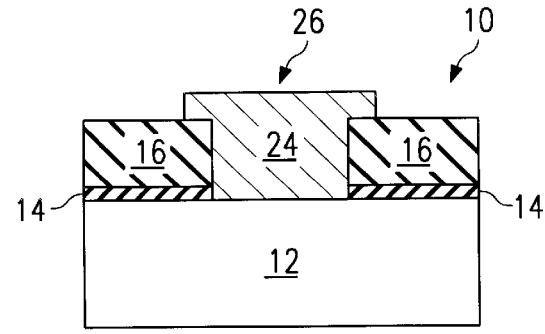

FIG. 2D illustrates device 10 after removing resist 20. The remaining steps of the alternative method to form contact 26 to substrate 12 illustrated in FIGS. 2D–2F are similar to those steps described above with reference to FIGS. 1D–1F.

Figure 3A:
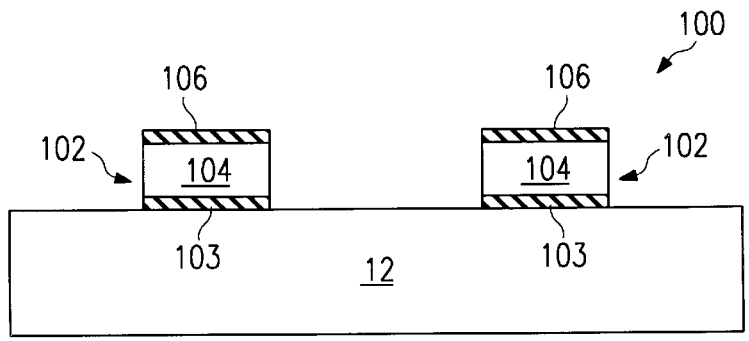
FIGS. 3A–3G illustrate a method for forming a self-aligned contact to a substrate.

FIGS. 3A–3G illustrate a method for forming a self-aligned contact to substrate 12, which incorporates the advantages described above with reference to FIGS. 1A–1F and 2A–2F. FIG. 3A illustrates a cross section of semiconductor device 100 during fabrication, which already includes gates 102 formed overlying substrate 12. In one embodiment, gates 102 comprise a gate dielectric film 103, a conductive film 104 overlying gate dielectric film 103, and an insulating film 106 overlying conductive film 104. Gates 102 may be formed using any suitable technique, for example by: depositing or thermally growing gate dielectric film 103; depositing conductive film 104 overlying gate dielectric film 103; depositing insulating film 106 overlying conductive film 104; and patterning gate dielectric film 103, conductive film 104, and insulating film 106 together to form gates 102. Gate dielectric film 103 may be formed from oxide, oxynitride, or other suitable material with the desired dielectric properties. Conductive film 104 may be a metal, amorphous polysilicon, polysilicides, tungsten silicides, or other appropriate conductive material, as well as any combination of these films. Insulating film 106 may be formed from nitride with or without some oxide, or from other suitable insulating film or film combinations.

Figure 3B:
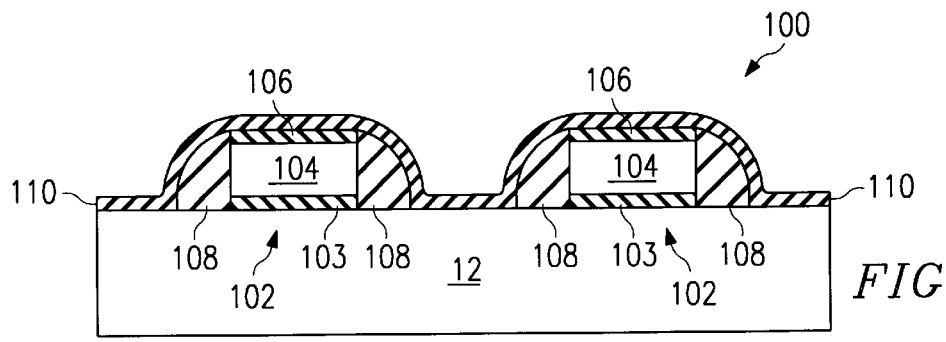

FIG. 3B illustrates device 100 after forming insulating sidewalls 108 and overlying gates 102 and insulating sidewalls 108 with a first stopping layer 110. Sidewalls 108 may be formed by depositing an insulating material, such as oxide or nitride, using a low pressure or plasma chemical vapor deposition (CVD) technique. The insulating material is then anisotropically etched until a desired portion of substrate 12 between gates 102 is exposed. First stopping layer 110 may be formed by depositing nitride with or without some oxide overlying gates 102 and insulating sidewalls 108 using a CVD technique.

Figure 3C:
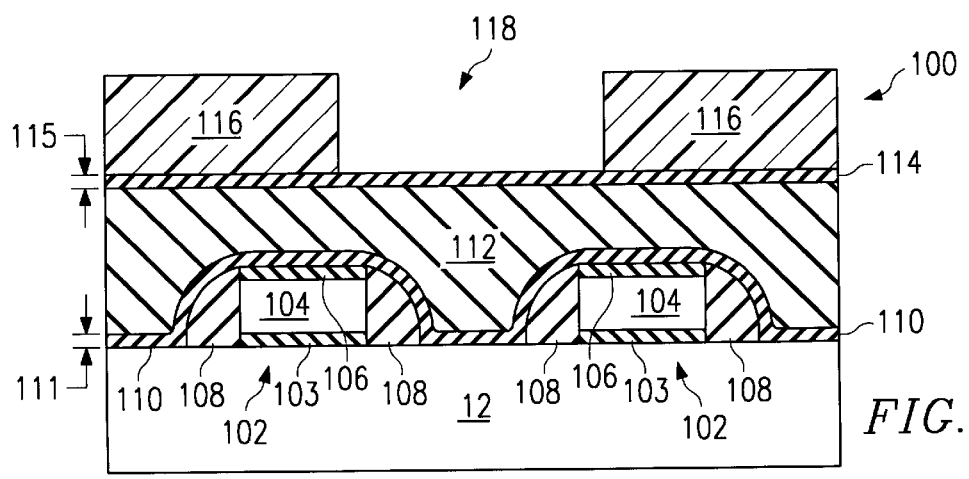

FIG. 3C illustrates device 100 after several additional process steps, including: forming insulating layer 112 overlying first stopping layer 110, forming second stopping layer 114 overlying insulating layer 112, forming resist 116 overlying second stopping layer 114, and patterning resist 116 to define contact region 118. The steps may be performed in a similar manner as described above with reference to the formation of first stopping layer 14, insulating layer 16, second stopping layer 18, and resist 20 in FIGS. 1A and 1B.

Figure 3D:
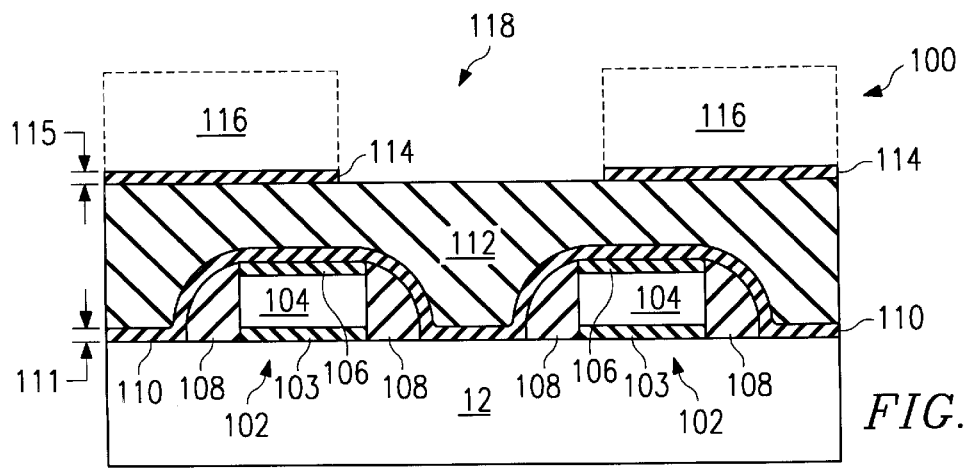
Figure 3E:
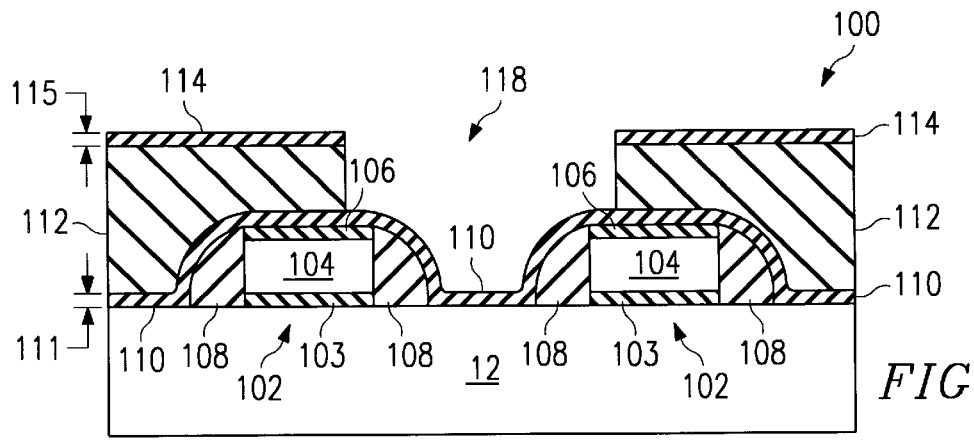

FIG. 3D illustrates device 100 after removing a portion of second stopping layer 114 in contact region 118 and the removing resist 116. In this embodiment, the remaining second stopping layer 114 acts as a hard mask to remove portions of insulating layer 112 within contact region 118 as illustrated in FIG. 3E. After removing portions of insulating layer 112, a large portion of the surface area of device 100 is covered by second stopping layer 114 and the bottom of contact region 118 is covered by first stopping layer 110.

Figure 3F:
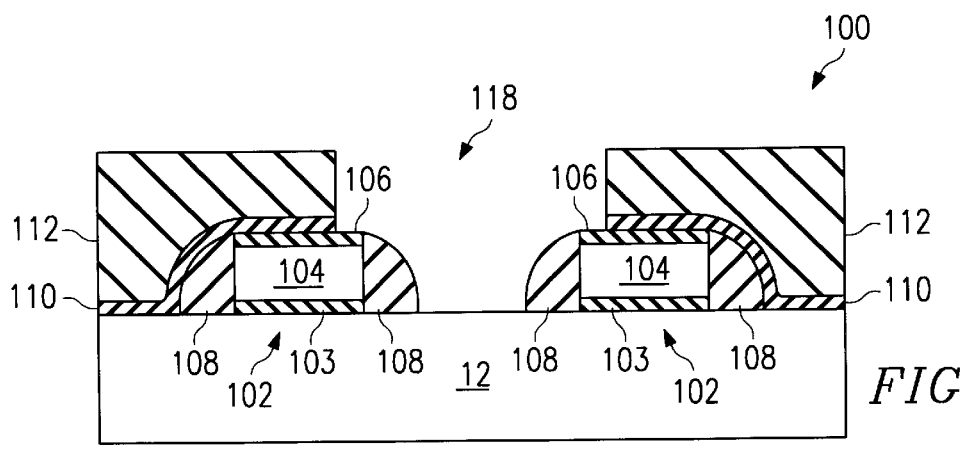

FIG. 3F illustrates device 100 after removing the remaining second stopping layer 114 and portions of first stopping layer 110 in contact region 118. As described above with reference to FIG. 1E, this removal of stopping layers 110 and 114 in a single process provides several technical advantages. In particular, second stopping layer 114 provides an end point to more accurately control the removal of portions of first stopping layer 110 in contact region 118. For example, first stopping layer 110 and second stopping 114 may be formed of the same material, such as nitride, with their respective thicknesses 111 and 115 substantially equal. In this embodiment, the removal of second stopping layer 114, detected optically or otherwise, may indicate the removal of portions of first stopping layer 110 in contact region 118. Moreover, thickness 111 of first stopping layer 110 may be chosen to be greater than or less than thickness 115 of second stopping layer 114 to provide an undershoot or overshoot margin, respectively, during the removal process that results in the structure of FIG. 3F.

Figure 3G:
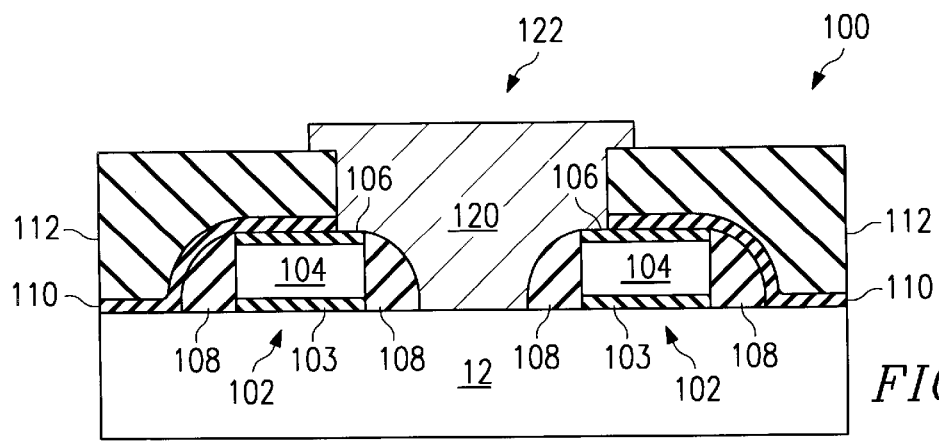

FIG. 3G illustrates device 100 after forming conductive material 120 in contact region 118 to complete fabrication of self-aligned contact, shown generally as element 122. Due to the insulating qualities of insulating film 106 and insulating sidewalls 108, and the careful removal of portions of first stopping layer 110 in contact region 118, self-aligned contact 122 couples substrate 12 and one or more overlying layers using the limited space between gates 102. This is accomplished without interfering with the structure or operation of gates 102. Self-aligned contact 122 provides enhanced component density in device 100, which is made possible in part by the accurate and controlled removal of stopping layers 110 and 114.

Figure 4A:
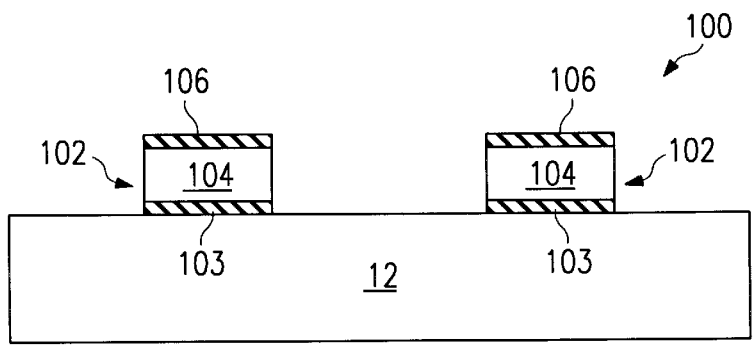
FIGS. 4A–4G illustrate an alternative method for forming a self-aligned contact to a substrate.
Figure 4B:
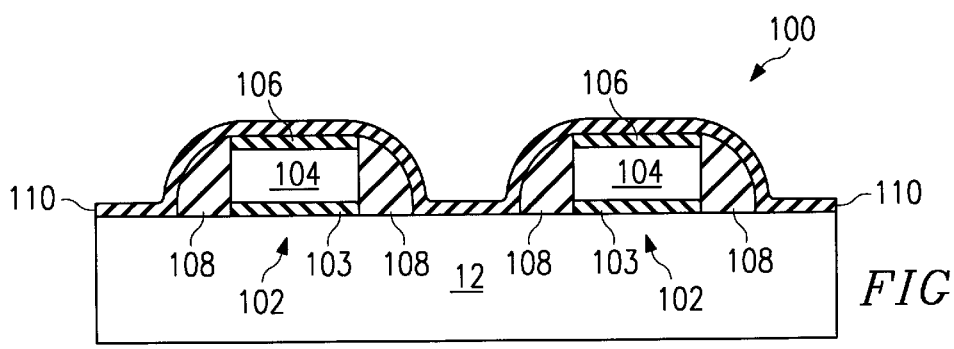
Figure 4C:
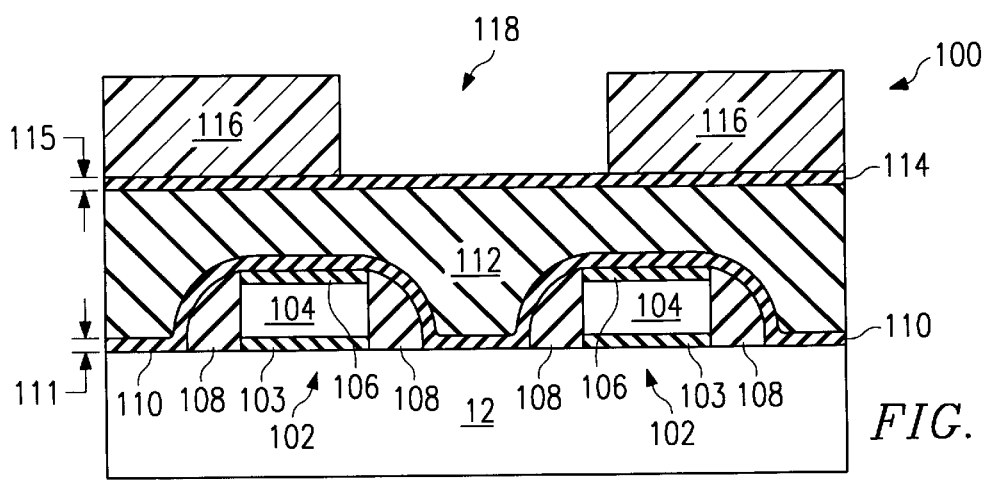
Figure 4D:
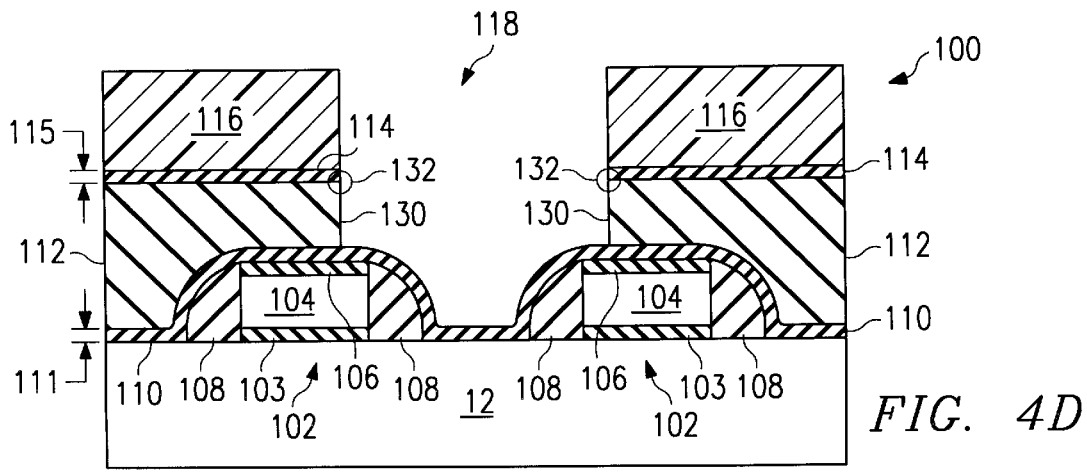

FIGS. 4A–4G illustrate an alternative method of forming self-aligned contact 122 to substrate 12. FIGS. 4A–4C illustrate the same process steps described above with reference to FIGS. 3A–3C. However, instead of removing resist 116 as shown above in FIG. 3D, resist 116 remains in FIG. 4D during the removal of portions of insulating layer 112 in contact region 118.

In one embodiment, the removal of vertically aligned portions of second stopping layer 114 and insulating layer 112 may be performed by an anisotropic etch that initially "blows through" portions of second stopping layer 114, and then develops selectivity to first stopping layer 110 as the etch progress through insulating layer 112. The selectivity developed in a "blow through" etch may result from developing chemistries as etched particles and other residuals are released and interact with the etch process. In another embodiment, different removal processes may be used to specifically remove second stopping layer 114 and insulating layer 112 in two separate steps.

Using either a single "blow through" removal step or two separate removal steps, resist 116 and second stopping layer 114 together act as a hybrid soft/hard mask during removal of portions of insulating layer 112. For example, portions of resist 116, especially those portions adjacent to contact region 118, may be chipped away during the removal process to expose second stopping layer 114. Second stopping layer 114 may then provide additional protection from the etch process to maintain well-defined sidewalls 130 and sharp corners 132 of insulating layer 112. Furthermore, since second stopping layer 114 provides an extra barrier of protection to insulating layer 112, a thinner resist 116 may be used to improve patterning accuracy.

Figure 4E:
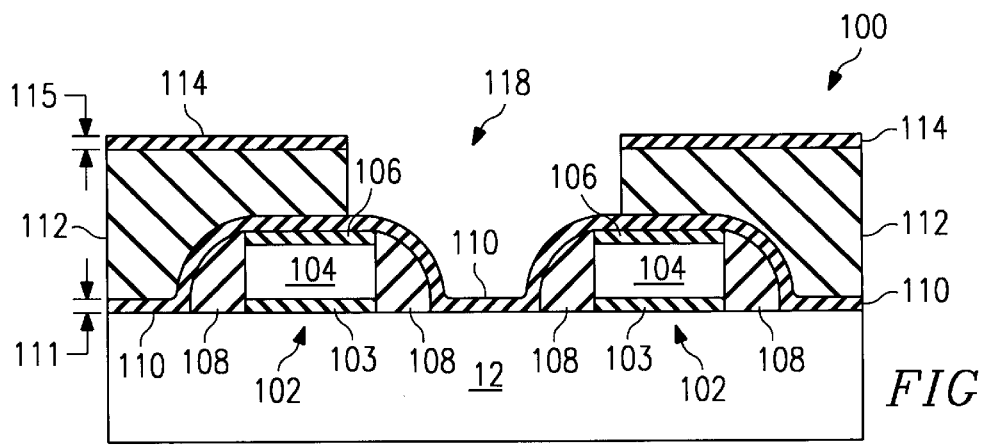
Figure 4F:
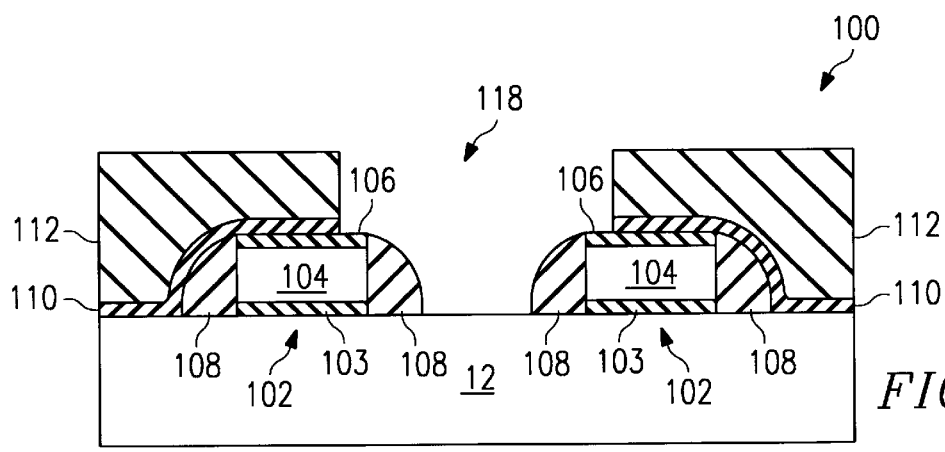
Figure 4G:
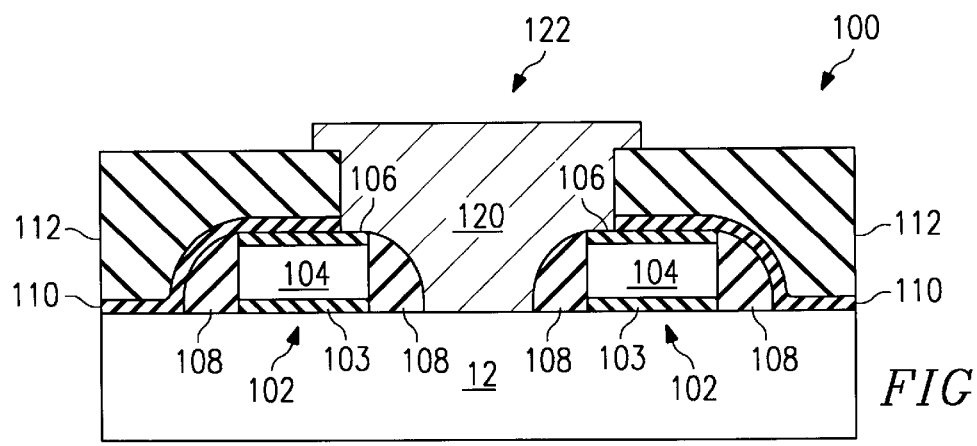

FIG. 4E illustrates device 100 after removing resist 116. The remaining steps of the alternative method to form self-aligned contact 122 to substrate 12 illustrated in FIGS. 4E–4G are similar to those steps described above with reference to FIGS. 3E–3G.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method of forming a conductive contact to a semiconductor substrate, said method comprising the steps of:

forming a first stopping layer over said semiconductor substrate, said first stopping layer comprised of nitride;

forming an insulating layer on said first stopping layer, said insulating layer is comprised of a material selected from the group consisting of: an oxide and a doped oxide;

forming a second stopping layer on said insulating layer, said second stopping layer comprised of nitride;

forming a patterned photoresist layer on said second stopping layer, said patterned photoresist layer having openings which expose a portion of said second stopping layer;

removing said exposed portions of said second stopping layer using a first removal means so as to expose portions of said insulating layer;

removing said exposed portions of said insulating layer using a second removal means so as to expose portions of said first stopping layer, said second removal means does not substantially remove any exposed portions of said first stopping layer or said second stopping layer;

removing said patterned photoresist layer prior to said step of removing said exposed portions of said insulating layer; and simultaneously removing said exposed portions of said first stopping layer and remaining portions of said second stopping layer.

* * * * *